(12) United States Patent
Kugimoto et al.

(10) Patent No.: US 8,358,493 B2
(45) Date of Patent: Jan. 22, 2013

(54) ELECTROSTATIC CHUCK, PRODUCTION METHOD OF ELECTROSTATIC CHUCK AND ELECTROSTATIC CHUCK DEVICE

(75) Inventors: Hironori Kugimoto, Chiba (JP); Kazuto Ando, Chiba (JP); Yoshiaki Moriya, Chiba (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 323 days.

(21) Appl. No.: 12/703,419

(22) Filed: Feb. 10, 2010

(65) Prior Publication Data

US 2011/0149462 A1    Jun. 23, 2011

(30) Foreign Application Priority Data

Dec. 21, 2009   (JP) .................. 2009-289548

(51) Int. Cl.
  *H01L 21/683*    (2006.01)
  *H01B 1/02*    (2006.01)
(52) U.S. Cl. ..................... 361/234; 252/520.5
(58) Field of Classification Search .............. 361/324; 252/520.5; 279/128; 501/98.4
  See application file for complete search history.

(56) References Cited

U.S. PATENT DOCUMENTS

| | | | | |
|---|---|---|---|---|
| 5,767,027 A * | 6/1998 | Sakon et al. | ................ | 501/98.4 |
| 7,569,167 B2 * | 8/2009 | Abe | ........................... | 252/520.5 |
| 7,582,367 B2 * | 9/2009 | Aihara et al. | ................ | 428/701 |
| 2003/0049499 A1 * | 3/2003 | Murakawa et al. | .......... | 428/697 |
| 2011/0260121 A1 * | 10/2011 | Yano et al. | ............... | 252/519.51 |

FOREIGN PATENT DOCUMENTS

| | | | |
|---|---|---|---|
| JP | 10189698 A | * | 12/1996 |
| JP | 2000216232 A | * | 1/1999 |
| JP | 2006179531 A | * | 12/2004 |

OTHER PUBLICATIONS

Yonehara et al, Experimental Relationship between Surface Roughness, Glossiness and Color of Chromatic Colored Metal, Mar. 12, 2004, Material Transactions, vol. 45, No. 4 (2004) pp. 1027 to 1032.*

* cited by examiner

*Primary Examiner* — Stephen W Jackson
*Assistant Examiner* — Angela Brooks
(74) *Attorney, Agent, or Firm* — Oblon, Spivak, McClelland, Maier & Neustadt, L.L.P.

(57) ABSTRACT

The present invention relates to an electrostatic chuck comprising a specific composite oxide sintered body, wherein in the sintered body, an L* value of a reflected color tone measured by a C light source on a 2° angle visual field condition is 10 or more and 50 or less in a CIEL*a*b* color system prescribed in JIS Z 8729-1994 and an electrostatic chuck device comprising an electrostatic chuck member (A) having a tabular body provided with a clamping surface for clamping a sample by the electrostatic force, an internal electrode layer for clamping a sample by electrostatic force which is provided on the back face of the tabular body and an insulation layer, wherein at least the sample clamping surface of the tabular body in the electrostatic chuck member (A) comprises the composite oxide sintered body constituting the electrostatic chuck described above.

13 Claims, 3 Drawing Sheets

ELECTROSTATIC CHUCK, PRODUCTION METHOD OF ELECTROSTATIC CHUCK AND ELECTROSTATIC CHUCK DEVICE

TECHNICAL FIELD

The present invention relates to an electrostatic chuck, a production process for the same and an electrostatic chuck device. More specifically, it relates to an electrostatic chuck used for holding semiconductor wafers in semiconductor manufacturing equipments, a production process for the same and an electrostatic chuck device.

BACKGROUND ART

Chuck devices for holding wafers are used in film-forming equipments such as CVD equipments, sputtering equipments and the like and etching equipments for fine processing which are used in semiconductor manufacturing steps.

In the above chuck devices, a vacuum chuck system and a mechanical cramp system have so far been employed, and an electrostatic chuck (ESC) system in which a semiconductor wafer is adsorbed by virtue of an electrostatic attracting force (coulomb force) has come to be used in accordance with a rise in a degree of a semiconductor production process in recent years. The above electrostatic chuck system exerts excellent characteristics in terms of correction of a wafer flatness and soaking as compared with a vacuum chuck system and a mechanical cramp system which have so far been used. Operation characteristics of an electrostatic chuck include preferably generating a large chucking force during applying a voltage to prevent an adsorbed matter from falling and reducing immediately the chucking force when releasing the applied voltage to make it possible to readily detach the adsorbed matter.

On the other hand, steps in which halogen base corrosive gases such as a fluorine base corrosive gas, a chlorine base corrosive gas and the like and plasma thereof are used are included in a semiconductor manufacturing line of IC, LSI, VLS and the like. Among them, fluorine base gases such as $CF_4$, $SF_6$, HF, $NF_3$, $F_2$ and the like and chlorine base gases such as $Cl_2$, $SiCl_4$, $BCl_3$, HCl and the like are used in steps of dry etching, plasma etching, cleaning and the like, and therefore corrosion brought about by the above corrosive gases and plasma raises a problem to constitutional members such as an electrostatic chuck and the like in a semiconductor manufacturing apparatus.

In this connection, yttrium-aluminum-garnet and matters obtained by adding oxides of rare earth elements excluding yttrium to yttrium-aluminum-garnet have so far been used as a corrosion resistant material for an electrostatic chuck (refer to, for example, a patent documents 1 to 3).

It is disclosed in the patent document 1 described above that the corrosion resistance is improved by combining yttrium aluminum composite oxides with rare earth elements excluding yttrium. This is considered to be attributable to the facts that halides of rare earth elements excluding yttrium have a pretty higher vaporization temperature than those of halides of yttrium and aluminum and that the halides produced work as a protective film on the surface to inhibit vaporization of yttrium and aluminum and reaction thereof with halogens.

The rare earth elements (RE) excluding yttrium (Y) are preferably at least one selected from lanthanum (La), neodymium (Nd), samarium (Sm), gadolinium (Gd) and dysprosium (Dy) in terms of availability and an effect of improving the corrosion resistance. It is described therein that among them, samarium (Sm) and gadolinium (Gd) have a marked effect of improving the corrosion resistance.

Patent document 1: Japanese Patent Application Laid-Open No. 315308/2004
Patent document 2: Japanese Patent Application Laid-Open No. 151559/2001
Patent document 3: Japanese Patent Application Laid-Open No. 236871/1998

SUMMARY OF THE INVENTION

Problems to be Solved by the Invention

In conventional electrostatic chucks, a voltage of higher than 2 kV is used in order to adsorb and fix wafers when a volume resistivity of an adsorbing surface material is larger than, for example, $1.0 \times 10^{14}$ Ω·cm, and this provides the problem that a wafer adsorbed and fixed is charged with electricity and liable to be damaged. Considered is a method in which a thickness of an electrostatic chuck material in an electrostatic chuck is reduced to, for example, less than 0.3 mm in order to increase clamping force. In this case, however, involved therein are the problems that the voltage resistance is reduced to make it impossible to apply a sufficiently high voltage when the above material is used for an electrostatic chuck and that the electrostatic chuck is broken during processing.

The present invention has been made under the above circumstances, and an object thereof is to provide an electrostatic chuck which is used in a halogen base corrosive gas such as a fluorine base corrosive gas, a chlorine base corrosive gas and the like and a plasma thereof and which has sufficiently large clamping force, a production process for the same and an electrostatic chuck device which can be operated at a low voltage and which can be increased in a thickness of a layer comprising a composite oxide sintered body (referred to as an insulating dielectric material) constituting a sample clamping surface.

Means for Solving the Problems

Intensive investigations repeated by the present inventors in order to achieve the object described above have resulted in obtaining the following knowledge.

The sufficiently large clamping force is obtained even at a low dielectric constant by allowing at least a part of an electrostatic chuck which is exposed to a halogen base corrosive gas or a plasma thereof to comprise a yttrium aluminum composite oxide sintered body or a composite oxide sintered body containing aluminum, yttrium and a rare earth element excluding yttrium and allowing an L* value of a reflected color tone of the above sintered body in a CIEL*a*b* color system which is measured on prescribed conditions to fall in a specific range.

Also, it has been found that the electrostatic chuck having the above properties can efficiently be produced by subjecting the chuck to specific operation.

Further, it has been found that in an electrostatic chuck device comprising an electrostatic chuck member having a tabular body provided with a clamping surface for clamping a sample such as a wafer and the like by the electrostatic force, an internal electrode for clamping a sample with electrostatic force which is provided on a back face of the tabular body and an insulation layer and a base member for controlling temperature in which a flow channel for circulating a medium is formed, a composite oxide sintered body having the properties described above is provided at least on the sample clamping surface of the tabular body in the electrostatic chuck member described above, whereby the electrostatic chuck device which can meet the object described above is obtained. The present invention has been completed based on the above knowledge.

That is, the present invention is as shown below.

(1) An electrostatic chuck comprising a yttrium aluminum composite oxide sintered body or a composite oxide sintered body containing aluminum, yttrium and a rare earth element excluding yttrium, wherein in the composite oxide sintered body, an L* value of a reflected color tone measured by a C light source on a 2° angle visual field condition is 10 or more and 50 or less in a CIE (International Illumination Committee) L*a*b* color system prescribed in JIS Z 8729-1994.

(2) The electrostatic chuck according to the above item (1), wherein a content of metal elements other than aluminum and the rare earth element in the composite oxide sintered body is 500 ppm by mass or less.

(3) The electrostatic chuck according to the above item (1) or (2), wherein oxygen deficiencies are contained in a crystal structure of the composite oxide sintered body.

(4) The electrostatic chuck according to any of the above items (1) to (3), wherein the crystal structure of the composite oxide sintered body is a crystal structure which is a garnet type crystal phase or a crystal structure comprising a garnet type crystal phase and at least one selected from a perovskite type crystal phase and a monoclinic crystal phase.

(5) The electrostatic chuck according to any of the above items (1) to (4), wherein the rare earth element excluding yttrium is samarium and/or gadolinium, and a ratio ($N_{RE}/(N_Y+N_{RE})$) of number of atoms ($N_{RE}$) of either one or both of samarium and gadolinium to a sum ($N_Y+N_{RE}$) of number of atoms ($N_Y$) of yttrium and number of atoms ($N_{RE}$) of either one or both of samarium and gadolinium is 0 or more and less than 0.5.

(6) A production process for the electrostatic chuck according to any of the above items (1) to (5) comprising a composite oxide sintered body formed by the following step, comprising a step in which the composite oxide sintered body is formed by calcining a green body having a prescribed shape containing aluminum oxide and yttrium oxide or aluminum oxide, yttrium oxide and oxide of a rare earth element excluding yttrium in vacuum, inert gas atmosphere or reducing gas atmosphere at a temperature of 1000° C. or higher and 1800° C. or lower.

(7) An electrostatic chuck device comprising an electrostatic chuck member (A) having a tabular body provided with a clamping surface for clamping a sample by the electrostatic force, an internal electrode layer for clamping a sample by electrostatic force which is provided on the back face of the tabular body and an insulation layer, wherein at least the sample clamping surface of the tabular body in the electrostatic chuck member (A) comprises the composite oxide sintered body constituting the electrostatic chuck according to any of the above items (1) to (5).

(8) The electrostatic chuck device according to the above item (7), further comprising a base member (B) for controlling temperature in which a flow channel for circulating a medium is formed.

(9) The electrostatic chuck device according to the above item (7) or (8), wherein the electrostatic chuck member (A) is prepared by integrating the tabular body provided with a sample clamping surface, the internal electrode for clamping a sample with electrostatic force which is provided on a back face of tabular body and the insulation layer via an adhesive layer, and the above electrostatic chuck member is integrated with the base member (B) for controlling temperature via an adhesive layer.

(10) The electrostatic chuck device according to any of the above items (7) to (9), wherein a resistive heating element is provided between the electrostatic chuck member (A) and the base member (B) for controlling temperature.

(11) The electrostatic chuck device according to any of the above items (7) to (10), wherein an electrostatic force in applying a voltage of 1.5 kV to the electrostatic chuck member having the tabular body comprising a composite oxide sintered body layer having a thickness of 0.5 mm at a sample clamping surface temperature of 25° C. is 10 to 30 kPa.

(12) The electrostatic chuck device according to any of the above items (7) to (11), wherein the composite oxide sintered body constituting the sample clamping surface in the electrostatic chuck member (A) has a thickness of 0.3 to 2.0 mm.

Effect of the Invention

According to the present invention, capable of being provided are an electrostatic chuck which is used in halogen base corrosive gases such as a fluorine base corrosive gas, a chlorine base corrosive gas and the like and plasma thereof and which has sufficiently large clamping force, a production process for the same and an electrostatic chuck device which can be operated at a low voltage and which can be increased (for example, 0.3 mm or more) in a thickness of an insulating dielectric material constituting a sample clamping surface.

EXPLANATION OF CODES

Figure 1:
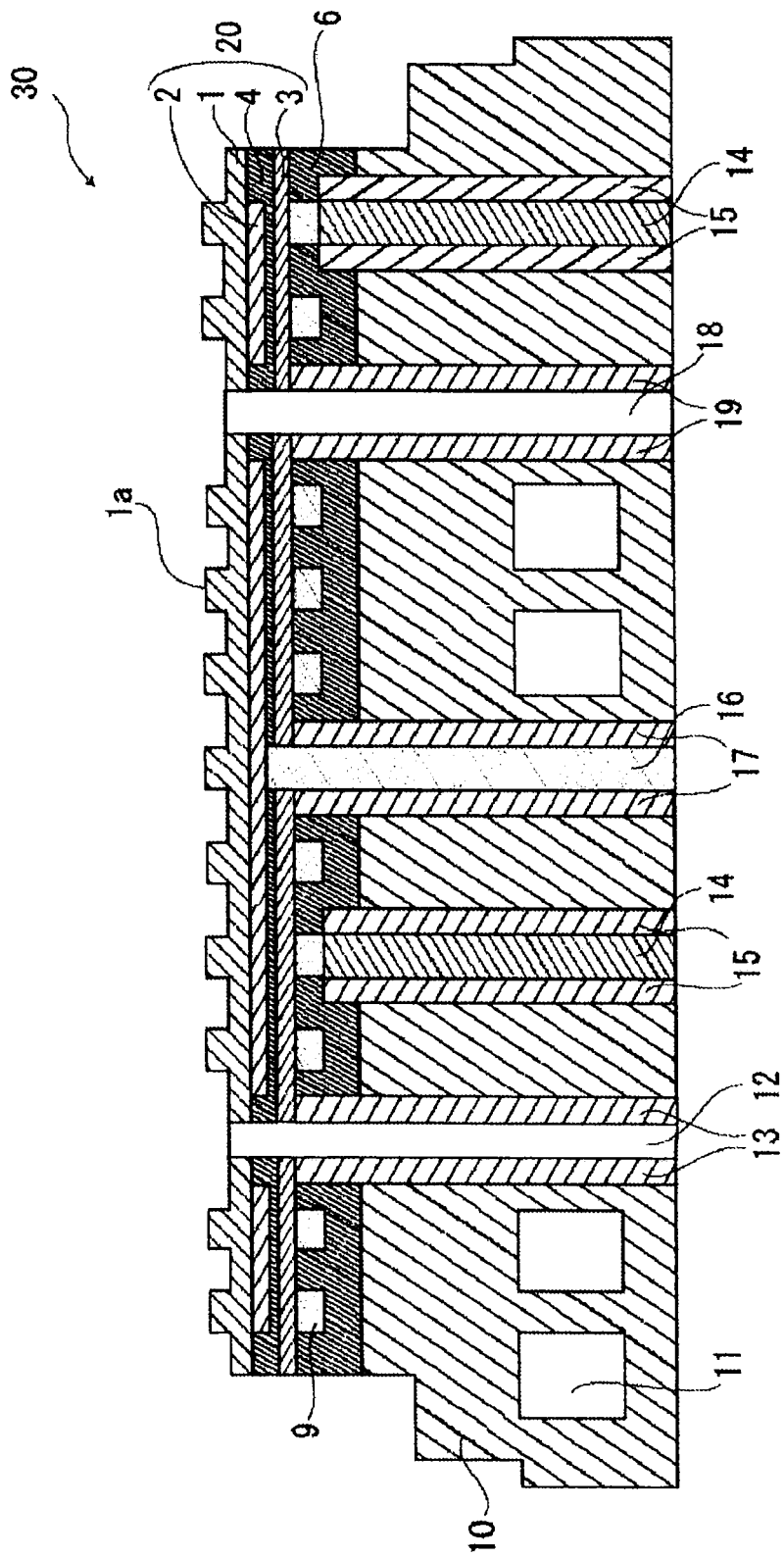
FIG. 1 is a schematic cross-sectional drawing showing one example of the electrostatic chuck device of the present invention.

1 Tabular body provided with a sample clamping surface
1a Sample clamping surface
2 Internal electrode layer for clamping a sample with electrostatic force
3 Insulation layer
4, 6 Adhesive layers
9 Resistive heating element
10 Base member for controlling temperature
11 Flow channel for circulating a medium
12 Cooling gas introducing hole
13, 15, 17, 19 Insulating hollow tubes
14, 16 Feeding terminals
18 lift pin hole
20 Electrostatic chuck member
30 Electrostatic chuck device

EMBODIMENTS FOR CARRYING OUT THE INVENTION

First, the electrostatic chuck of the present invention shall be explained.

Electrostatic Chuck:

The electrostatic chuck of the present invention is an electrostatic chuck comprising a yttrium aluminum composite oxide sintered body or a composite oxide sintered body containing aluminum, yttrium and a rare earth element excluding yttrium, wherein in the composite oxide sintered body described above, an L value of a reflected color tone measured by a C light source on a 2° angle visual field condition is 10 or more and 50 or less in a CIE (International Illumination Committee) L*a*b* color system prescribed in JIS Z 8729-1994.

Conventional electrostatic chucks comprising a metal oxide sintered body have a volume resistance value of $1\times10^{14}$ Ω·cm or more and show characteristics of an electrostatic chuck of a coulomb type. Accordingly, the clamping force is proportional to the dielectric constant and the applied voltage and inversely proportional to the thickness. The present inventors have found that the sufficiently high clamping force is not obtained at a dielectric constant of less than 10 in a frequency region of 1 MHz or less and less than 30 in a frequency region of 1 kHz or less even if the applied voltage and the thickness are controlled. However, they have found that the sufficiently high clamping force is obtained by allowing an L* value of a reflected color tone of the above sintered body which is measured on prescribed conditions in a CIEL*a*b* color system to fall in a specific range even if a dielectric constant is less than 10 in a frequency region of 1 MHz or less and less than 30 in a frequency region of 1 kHz or less.

The L* value described above shows an intensity (brightness) of a reflected light and tends to be reduced when oxygen deficiency absorbing light is increased. Accordingly, the phenomenon described above in which the sufficiently high clamping force is obtained is considered to be attributable to introduction of oxygen deficiency.

This is estimated to be attributable to that when oxygen deficiencies are generated in a crystal lattice, a plus charge (hole) is produced in order to maintain a balance between charges and that this hole produced moves to a wafer side in measuring an adsorption characteristic (in applying voltage) to allow an apparent polarizability (coulomb force) to be increased, so that the clamping force grows high.

In the composite oxide sintered body in the electrostatic chuck of the present invention, an L* value of a reflected color tone measured by a C light source on a 2° angle visual field condition has to be 10 or more and 50 or less in a CIE (International Illumination Committee) L*a*b* color system prescribed in JIS Z 8729-1994.

The above L* value shows, as described above, an intensity (brightness) of a reflected light and tends to be reduced when oxygen deficiency absorbing light is increased. If the L* value is less than 10, a conductive pass is formed by holes produced, and the withstand voltage is deteriorated. On the other hand, if it exceeds 50, the sufficiently high clamping force is not obtained. The L* value is preferably 10 to 40, more preferably 10 to 30

Impurities contained in the composite oxide sintered body are likely to exert an influence on the L* value described above. Accordingly, in the electrostatic chuck of the present invention, a content of metal elements other than aluminum and the rare earth element in the composite oxide sintered body is preferably 500 ppm by mass or less, more preferably 100 ppm by mass or less in order to exclude an influence to the L* value.

A crystal structure of the above composite oxide sintered body is preferably a crystal structure which is a garnet type single phase. However, it may be a crystal structure comprising a garnet type crystal phase and at least one selected from a perovskite type crystal phase and a monoclinic crystal phase. In the above composite oxide sintered body, the strength providing practically no problems is obtained by having the crystal structure described above.

The above composite oxide sintered body may be only the yttrium aluminum composite oxide sintered body, and it is preferably doped with at least one of samarium and gadolinium as a rare earth element in order to enhance the corrosion resistance. Also, samarium and gadolinium have larger ionic radius than that of yttrium, and therefore it is considered that when they are present in a yttrium aluminum oxide crystal, the crystal lattice is distorted and that oxygen deficiencies are liable to be produced in order to eliminate the above distortion.

A ratio ($N_{RE}/(N_Y+N_{RE})$) of number of atoms ($N_{RE}$) of either one or both of samarium and gadolinium to a sum ($N_Y+N_{RE}$) of number of atoms ($N_Y$) of yttrium and number of atoms ($N_{RE}$) of either one or both of samarium and gadolinium is preferably 0 or more and less than 0.5. If it is 0.5 or more, a composite oxide of aluminum and a rare earth element is produced as a second phase, and deterioration of the mechanical strength and degradation of the durability to corrosive gases are brought about.

In the electrostatic chuck of the present invention, at least a part of the above electrostatic chuck which is exposed to a halogen base corrosive gas or a plasma thereof comprises preferably a yttrium aluminum composite oxide sintered body or a composite oxide sintered body containing aluminum, yttrium and a rare earth element excluding yttrium, and the constitution thereof shall not specifically be restricted.

Next, a production process for the electrostatic chuck of the present invention shall be explained.

Production Process for the Electrostatic Chuck:

The production process for an electrostatic chuck according to the present invention is a production process for the electrostatic chuck of the present invention described above comprising a composite oxide sintered body formed by the following step, and it is characterized by comprising a step in which a composite oxide sintered body is formed by calcining a green body having a prescribed shape containing aluminum oxide and yttrium oxide or aluminum oxide, yttrium oxide and oxide of a rare earth element excluding yttrium at a temperature of 1000° C. or higher and 1800° C. or lower in vacuum, in inert gas atmosphere or reducing gas atmosphere.

The yttrium aluminum composite oxide sintered body or the composite oxide sintered body containing aluminum, yttrium and a rare earth element excluding yttrium in which an L value of a reflected color tone measured by a C light source on a 2° angle visual field condition is 10 or more and 50 or less (estimated to have oxygen deficiency) in a CIE (International Illumination Committee) L*a*b* color system prescribed in JIS Z 8729-1994 can be formed by the above process.

If the calcining temperature described above is lower than 1000° C., oxygen deficiencies are likely to be less liable to be produced. On the other hand, if it exceeds 1800° C., melting is likely to be generated. The preferred calcining temperature falls in a range of 1500 to 1700° C.

The electrostatic chuck of the present invention provided with the composite oxide sintered body thus formed at least in a part exposed to a halogen base corrosive gas or a plasma thereof exerts the sufficiently high clamping force even in halogen base corrosive gases such as a fluorine base corrosive gas, a chlorine base corrosive gas and the like and plasma thereof.

Next, a specific production process for the composite oxide sintered body described above used for the electrostatic chuck of the present invention shall be explained.

First, commercial aluminum oxide ($Al_2O_3$) powder, commercial yttrium oxide ($Y_2O_3$) powder and commercial samarium oxide ($Sm_2O_3$) powder and commercial gadolinium oxide ($Gd_2O_3$) powder as oxides of rare earth elements excluding yttrium which have a purity of about 99.9% and an average particle diameter of 0.01 to 1.0 μm are used as raw material powders and mixed respectively in prescribed proportions. In this connection, if the raw material powders have an average particle diameter of less than 0.01 μm, they are expensive, economically disadvantageous and inferior in handling, and therefore the production process is not easy. Further, if it is larger than 1.0 μm, the calcining property is deteriorated, and a reduction in the density is brought about. In addition thereto, a particle diameter thereof in the sintered body grows larger, whereby a deterioration thereof in a corrosive gas or a plasma thereof is likely to be accelerated.

A solvent is preferably used for mixing the raw material powders. The solvent shall not specifically be restricted and includes, for example, water, alcohols and the like. Also, a dispersant may be used for mixing the raw material powders. The dispersant shall not specifically be restricted, and compounds adsorbing on a particle surface to raise a dispersion efficiency are used. Further, substances containing no metal ions as counter ions are preferred in order to reduce metal impurities. The dispersant is added also in terms of preventing hetero aggregation between different particles.

Further, it is efficient to use a dispersing equipment for mixing the raw material powders. The dispersing equipment makes it efficient to adsorb the dispersant on a particle surface and makes it possible to evenly mix different particles. The dispersing equipment shall not specifically be restricted and includes, for example, dispersing equipments using media such as a supersonic wave, a planetary ball mill, a ball mill, a sand mill and the like and medialess dispersing equipments such as a ultrahigh pressure crushing dispersing equipment and the like. The medialess dispersing equipments have less contaminants mixed therein and are advantageous particularly for electrostatic chuck members for semiconductor manufacturing apparatuses.

Next, the above mixed powder is pelletized by a known method to prepare granules, and then the granules are molded into a prescribed shape by a known molding means. Thereafter, the above green body is degreased in the air at 50 to 600° C. and then calcined in the air, vacuum, inert gas atmosphere or reducing gas atmosphere at 1000 to 1800° C., preferably 1500 to 1700° C. for 1 to about 10 hours, whereby a minute sintered body having a relative density of 98% or more can be prepared. Calcining does not proceed at a temperature of lower than 1000° C., and the density is not raised. On the other hand, melting is brought about at a temperature of exceeding 1800° C., and therefore it is not preferred.

In the calcining method, calcining may be carried out at an atmospheric pressure, and a pressure calcining method such as hot press, hot isotactic press (HIP) and the like is preferred in order to obtain a minute sintered body. A pressing force in pressure calcining shall not specifically be restricted and is usually 10 to 40 MPa.

The sintered body obtained by calcining in vacuum, inert gas atmosphere or reducing gas atmosphere is estimated to have oxygen deficiency. The sintered body described above and the sintered body obtained by calcining in the air are further subjected to heat treatment in vacuum or reducing gas atmosphere at 1000 to 1800° C., preferably 1200 to 1600° C. for 1 to about 100 hours, whereby oxygen deficiency can be introduced or increased.

In order to form the composite oxide sintered body in which an L value of a reflected color tone measured by a C light source on a 2° angle visual field condition is 10 or more and 50 or less in a CIE (International Illumination Committee) L*a*b* color system prescribed in JIS Z 8729-1994, essential is a step in which the green body described above is calcined in vacuum, inert gas atmosphere or reducing gas atmosphere at a temperature of 1000° C. or higher and 1800° C. or lower.

Next, the electrostatic chuck device of the present invention shall be explained.

Electrostatic Chuck Device:

The electrostatic chuck device of the present invention is an electrostatic chuck device comprising an electrostatic chuck member (A) having a tabular body provided with a clamping surface for clamping a sample by the electrostatic force, an internal electrode layer for clamping a sample by electrostatic force which is provided on the back face of the tabular body and an insulation layer. At least the sample clamping surface of the tabular body in the electrostatic chuck member (A) comprises the composite oxide sintered body constituting the electrostatic chuck of the present invention described above. The electrostatic chuck device further comprises preferably a base member (B) for controlling temperature in which a flow channel for circulating a medium is formed.

In the above electrostatic chuck device, the electrostatic chuck member (A) prepared by integrating the tabular body provided with a sample clamping surface, the internal electrode layer for clamping a sample with electrostatic force which is provided on a back face of tabular body and the insulation layer via an adhesive layer is further integrated preferably with the base member (B) for controlling temperature via an adhesive layer.

Further, a resistive heating element is preferably provided between the electrostatic chuck member (A) and the base member (B) for controlling temperature.

Next, the electrostatic chuck device shall be explained with reference to the attached drawings.

FIG. 1 is a schematic cross-sectional drawing showing one example of the electrostatic chuck device of the present invention. In an electrostatic chuck device 30, an electrostatic chuck member 20 prepared by integrating a tabular body 1 having a sample clamping surface 1a provided with a lot of convex parts for electrostatically adsorbing a sample such as a silicon wafer and the like, an internal electrode layer 2 for clamping a sample with electrostatic force which is provided on a back face of tabular body and an insulation layer 3 via an adhesive layer 4 is integrated with a base member 10 for controlling temperature in which a flow channel 11 for circulating a medium is formed via an adhesive layer 6, and the electrostatic chuck device has a structure in which a resistive heating element 9 is embedded in the above adhesive layer 6.

The resistive heating element 9 is embedded in the adhesive layer 6 in a state in which it is bonded to the insulation layer 3. Also, a cooling gas (helium gas, nitrogen gas and the like) introducing hole 12 is formed by an insulating hollow tube in the tabular body 1 having a sample clamping surface 1a, the internal electrode layer 2 for clamping a sample with electrostatic force, the insulation layer 3 and the base member 10 for controlling temperature so that the introducing hole 12 passes through them in a thickness direction thereof. Further, an insulating hollow tube 15 is mounted as shown in FIG. 1, and a feed terminal 14 is provided in a lift pin hole thereof so that it is brought into contact with the resistive heating element 9. Also, an insulating hollow tube 17 is mounted as shown in FIG. 1, and a feed terminal 16 is provided in a lift pin hole thereof so that it is brought into contact with the internal electrode layer 2 for clamping a sample with electrostatic force.

Further, an insulating hollow tube 19 is mounted as shown in FIG. 1, and a pin (not illustrated) for allowing a sample such as a silicon wafer and the like to go up and down is provided in a lift pin hole 18 thereof.

Tabular Body Having a Sample Clamping Surface:

In the electrostatic chuck device 30 of the present invention, at least the sample clamping surface of the tabular body 1 having a sample clamping surface 1a which is used for the electrostatic chuck member 20 has to comprise the composite oxide sintered body (insulating dielectric material) constituting the electrostatic chuck of the present invention described above, and the tabular body 1 itself is preferably a layer of the above composite oxide sintered body in terms of preparing the electrostatic chuck device.

The composite oxide sintered body layer described above is a yttrium aluminum composite oxide sintered body or a composite oxide sintered body layer containing aluminum, yttrium and a rare earth element excluding yttrium, and in the composite oxide sintered body described above, an L* value of a reflected color tone measured by a C light source on a 2° angle visual field condition is 10 or more and 50 or less in a CIE (International Illumination Committee) L*a*b* color system prescribed in JIS Z 8729-1994. The sufficiently high electrostatic clamping force is obtained as shown below by providing the above composite oxide sintered body layer.

The L* value described above shows an intensity (brightness) of a reflected light and tends to be reduced when oxygen deficiency absorbing light is increased. Accordingly, the phenomenon described above in which the sufficiently high clamping force is obtained is considered to be attributable to introduction of oxygen deficiency.

This is estimated to be attributable to that when oxygen deficiencies are generated in a crystal lattice, a plus charge (hole) is produced in order to maintain a balance between charges and that this hole produced moves to a wafer side in measuring an adsorption characteristic (in applying voltage) to allow an apparent polarizability (coulomb force) to be increased, so that the clamping force grows high.

The above L* value shows, as described above, an intensity (brightness) of a reflected light and tends to be reduced when oxygen deficiency (hole) absorbing light is increased. If the L* value is less than 10, a conductive pass is formed by holes produced, and the withstand voltage is deteriorated. On the other hand, if it exceeds 50, the sufficiently high clamping force is not obtained. The L* value is preferably 10 to 40, more preferably 10 to 30.

Impurities contained in the composite oxide sintered body are likely to exert an influence on the L* value described above. Accordingly, in the electrostatic chuck of the present invention, a content of metal elements other than aluminum and the rare earth element in the composite oxide sintered body is preferably 500 ppm by mass or less, more preferably 100 ppm by mass or less in order to exclude an influence to the L* value.

In the above electrostatic chuck device 30, the composite oxide sintered body constituting the tabular body 1 in the electrostatic chuck member 20 has a thickness falling in a range of preferably 0.3 to 2.0 mm, more preferably 0.3 to 1.0 mm and further preferably 0.5 to 1.0 mm from the viewpoint of the voltage applied and the electrostatic clamping force.

Further, in the above electrostatic chuck device, the electrostatic clamping force in applying a voltage of 1.5 kV to the electrostatic chuck member 20 having the tabular body 1 comprising a composite oxide sintered body layer having a thickness of 0.5 mm at a sample clamping surface temperature of 25° C. can be 10 to 30 kPa, preferably 13 to 25 kPa and more preferably 15 to 22 kPa.

The electrostatic clamping force is a value measured by the following method.

<Electrostatic Clamping Force>

The sintered body is processed to a thickness of 0.5 mm and adhered in a constitution of alumina ceramic/electrode/sintered body to measure an clamping force to a silicon wafer at a sample clamping surface temperature of 25° C. on the conditions of an applied voltage of 1.5 kV, an applying time of 60 seconds and a vacuum (<0.5 Pa). The measurement is carried out by peeling off using a load cell, and a maximum peeling stress thereof obtained in the measurement is set to the clamping force.

Internal Electrode Layer for Clamping a Sample with Electrostatic Force:

In the above electrostatic chuck device 30, the internal electrode layer 2 for clamping a sample with electrostatic force (hereinafter referred to merely as "the internal electrode layer") used in the electrostatic chuck member 20 is an electrode layer provided on a back face of the tabular body 1 having a sample clamping surface 1a described above, and capable of being used as a material thereof are, for example, high melting metals such as titanium, tungsten, molybdenum, platinum and the like, carbon materials such as graphite, carbon and the like and conductive ceramics such as silicon carbide, titanium nitride, titanium carbide and the like.

The thermal expansion coefficients of the above electrode materials are preferably approximate as much as possible to the thermal expansion coefficients of the tabular body 1 described above and the insulation layer 3 described below in detail.

A thickness of the above internal electrode layer 2 is preferably 5 to 200 µm, more preferably 10 to 100 µm. If a thickness of the internal electrode layer falls in a range of 5 to 200 µm, the electric conductivity can be secured, and a thermal conductivity between a sample loaded on the tabular body 1 and the base member 10 for controlling temperature is improved.

The above internal electrode layer 2 can be formed by a sputtering method, a vacuum deposition method, a printing method and the like. A material of the feed terminal 16 for the above internal electrode layer 2 shall not specifically be restricted, and titanium is usually used therefor.

Insulation Layer:

In the above electrostatic chuck device 30, the insulation layer 3 used in the electrostatic chuck member 20 shall not specifically be restricted as long as it comprises a material which has a withstand voltage of 7 kV/mm or more and a low dielectric constant and which is excellent in corrosion against plasma and is less liable to bring about dielectric breakdown due to thermal degradation. An organic film and a ceramic layer can be used for the above insulation layer, and the ceramic layer is preferred in the present invention.

Ceramics constituting the ceramic layer described above shall not specifically be restricted as long as they have a volume resistivity value of $10^{13}$ to $10^{15}$ Ω·cm and a mechanical strength and are provided with a durability against corrosive gases and plasma thereof, and alumina ($Al_2O_3$) sintered bodies, alumina nitride (AlN) sintered bodies, alumina ($Al_2O_3$)-silicon carbide (SiC) composite sintered bodies and the like are suitably used.

A thickness of the above ceramic layer is preferably 0.3 to 3.0 mm, more preferably 0.5 to 1.5 mm from the viewpoints of the withstand voltage, the electrostatic clamping force and a thermal conductivity between a sample mounted on the tabular body 1 and the base member 10 for controlling temperature.

Adhesive Layer:

In the electrostatic chuck member 20 in the above electrostatic chuck device 30, the adhesive layer 4 is provided in order to integrate the tabular body 1 having a sample clamping surface 1a, the internal electrode layer 2 for clamping a sample with electrostatic force which is provided on a back face of tabular body and the insulation layer 3.

In the above electrostatic chuck device, the adhesive layer 6 is provided in order to integrate the electrostatic chuck member 20 and the base member 10 for controlling temperature.

Adhesives constituting the above adhesive layers 4 and 6 shall not specifically be restricted as long as both members concerned can firmly be adhered, and organic adhesives and silicone resin base adhesives are preferred.

The above adhesive layers 4 and 6 have a thermal conductivity of preferably 0.3 W/mK or more, more preferably 0.5 W/mK or more in order to transmit well coldness from the base member 10 for controlling temperature and heat from the resistive heating element 9 to a sample such as a wafer and the like and maintain the above sample at a desired temperature. Accordingly, substances containing powders of thermal conductive materials such as aluminum nitride, boron nitride, silicon nitride, silicon carbide, zinc oxide, magnesium oxide, alumina and the like are preferably used as the adhesive.

Base Member for Controlling Temperature:

The base member 10 for controlling temperature used in the above electrostatic chuck device 30 is a member in which a flow channel 11 for circulating a medium is formed, and a material therefor shall not specifically be restricted as long as it is a material which is excellent in a thermal conductivity and a processability. The above material includes, for example, metals such as copper, aluminum, stainless steel and the like.

At least a surface exposed to plasma in the base member 10 for controlling temperature is subjected preferably to almite treatment or coating treatment with a polyimide base resin and the like. The above coating treatment improves the plasma resistance, elevates the plasma resistant stability (prevention of abnormal discharge) and makes it possible to prevent scratches from being produced on the surface.

A medium flowing in the flow channel 11 provided in an inside of the above base member 10 for controlling temperature includes cooling media such as water, helium gas, nitrogen gas and the like. This allows the temperature to be controlled so that the sample under processing is maintained at a desired fixed temperature.

Resistive Heating Element:

In the above electrostatic chuck device, the resistive heating element 9 can be provided, if necessary, between the electrostatic chuck member 20 and the base member 10 for controlling temperature.

FIG. 1 shows an example in which the resistive heating element 9 is provided between the electrostatic chuck member 20 and the base member 10 for controlling temperature, to be specific, in an inside of the adhesive layer 6. The above resistive heating element 9 generates heat by supplying an electric power to the feed terminal 14 brought into contact with the above resistive heating element 9, and this allows the temperature to be controlled so that the sample under processing is maintained at a desired fixed temperature. The resistive heating element 9 shall not specifically be restricted, and molybdenum wires can be used.

In FIG. 1, a material constituting the insulating hollow tubes 13, 15, 17 and 19 shall not specifically be restricted as long as it has a volume resistivity value of $10^{13}$ to $10^{15}$ Ω·cm and a mechanical strength, and ceramics base materials such as alumina ($Al_2O_3$) sintered bodies, alumina nitride (AlN) sintered bodies, alumina ($Al_2O_3$)-silicon carbide (SiC) composite sintered bodies and the like are suitably used.

The electrostatic chuck device of the present invention thus obtained can be operated at a low voltage by using a composite oxide sintered body of specific properties having oxygen deficiency as the tabular body 1 having a sample clamping surface in the electrostatic chuck member. Further, a thickness of the insulating dielectric material constituting the above sample clamping surface can be increased to, for example, 0.3 mm or more, and it is excellent in a plasma resistance.

EXAMPLES

Next, the present invention shall be explained in more details with reference to examples, but the present invention shall by no means be restricted by these examples.

Various characteristics in the respective examples were measured according to methods shown below.

(1) Primary Average Particle Diameter of Raw Materials for Metal Oxide Powders:

Measured by means of a transmission type electron microscope (model "H-800", manufactured by Hitachi, Ltd.).

(2) Relative Density of Sintered Body:

A density of the sintered body was measured by an Archimedes method, and a proportion (relative density) thereof to a theoretical density determined in the following manner was calculated:

<Theoretical Density>

Theoretical density=unit cell weight (g)/unit cell volume ($cm^3$)

Unit cell weight: (unit cell weight of garnet type crystal phase×mol % of crystal phase)+(unit cell weight of perovskite type crystal phase×mol % of crystal phase)+(unit cell weight of monoclinic crystal phase×mol % of crystal phase)

Unit cell volume: (unit cell volume of garnet type crystal phase×mol % of crystal phase)+(unit cell volume of perovskite type crystal phase×mol % of crystal phase)+(unit cell volume of monoclinic crystal phase×mol % of crystal phase)

A unit cell weight of each crystal phase was calculated from the theoretical value assuming that all of a Sm element and a Gd element was solid-soluble in the crystal structure.

The theoretical value was used for a unit cell volume of each crystal phase assuming that the lattice constant was not changed by solid solution of a Sm element and a Gd element into yttrium aluminum oxide.

Further, a mol % of the crystal phase was calculated from a charged amount of the raw material powder using a $Al_2O_3$—$Y_2O_3$ base phase diagram.

(3) Identification of Crystal Phase in Sintered Body:

The crystal phase was identified by a powder X ray diffraction method using a model "X' Pert PRO MPD" manufactured by PANanalytical B.V. as an X ray diffraction apparatus. In Table 1, G is the garnet type crystal phase, and M is the monoclinic crystal phase.

(4) Dielectric Constant of Sintered Body:

The dielectric constant in a frequency region of 40 Hz to 1 MHz was measured by means of a model "Agilent 4294A Precision Impedance Analyzer" manufactured by Afilent Technologies, Inc. as a measuring equipment.

(5) Clamping Force of Sintered Body:

The sintered body was processed into a thickness of 0.5 mm and adhered in a constitution of alumina ceramic/electrode/sintered body to measure the clamping force to a silicon wafer at a sample clamping surface temperature of 25° C. on the conditions of an applied voltage of 1.5 kV, an applying time of 60 seconds and a vacuum (<0.5 Pa). The measurement was carried out by peeling off using a load cell, and a maximum peeling stress thereof obtained in the measurement was set to the clamping force.

(6) Color Tone of Sintered Body:

A reflected color tone of the square sintered body having a thickness of 2 mm and an edge of 60 mm in a CIE (International Illumination Committee) L*a*b* color system prescribed in JIS Z 8729-1994 was measured by a C light source on a 2° angle visual field condition by means of a handy type color analyzer (model "Colorimeter CT-310" manufactured by Konica Minolta Holdings Inc.) to determine L* (brightness) which was an index of oxygen deficiency.

(7) Impurities in Sintered Body:

A content of metal elements other than aluminum and rare earth elements in the sintered body was measured by the following method.

Measured elements: Na, Mg, K, Ca, Ti, Fe, Mn, Ni, Cu, Zn, Ba, Cr, B and Si

Sample processing method: the sintered body 0.3 g and sulfuric acid 10 ml were sealed in a vessel made of Teflon (registered trade name) and subjected to pressure acid decomposition at 230° C. for 17 hours, and a volume thereof was determined to prepare an analytical measurement sample.

Measuring method: Na and K elements were measured by a flameless atomic absorption method (model AA2BOZ, manufactured by Varian, Inc.), and the other elements were measured by an ICP mass spectrometry (model SPQ9200, manufactured by Seiko Instruments Inc.).

Examples 1 to 6

Used were commercial aluminum oxide ($Al_2O_3$) powder, commercial yttrium oxide ($Y_2O_3$) powder, commercial samarium oxide ($Sm_2O_3$) powder and commercial gadolinium oxide ($Gd_2O_3$) powder each having a purity of about 99.9% and an average particle diameter of 0.1 μm measured by means of a transmission type electron microscope (TEM), and the above powders were weighed and controlled so that compositions shown in Table 1 were obtained. Then, they were dispersed and wet-mixed by means of a ultimizer using water as a solvent and pelletized by spray drying to prepare a mixed powder.

Next, the above mixed powder was molded into a prescribed form by a known molding means. Then, it was calcined under pressure in argon gas at 1600° C. for 2 hours by means of a hot press to prepare each sintered body. In this case, the pressure force was 20 MPa.

Various characteristics of the respective sintered bodies obtained were determined, and the results thereof are shown in Table 1.

Example 7

The same operation as in Examples 1 to 6 was carried out to prepare a sintered body having a composition shown in Table 1. Then, the above sintered body was subjected to thermal treatment at 1400° C. for 12 hours in a hydrogen atmosphere. Various characteristics of the above thermally treated sintered body were determined, and the results thereof are shown in Table 1.

Comparative Examples 1 to 3

The same operation as in Examples 1 to 6 was carried out to prepare the respective sintered bodies having compositions shown in Table 1. Then, the respective sintered bodies were subjected to annealing treatment at 1400° C. for 12 hours in the air. Various characteristics of the above respective sintered bodies subjected to annealing treatment were determined, and the results thereof are shown in Table 1.

TABLE 1

| | Composition | Post-annealing | Impurity[1] (mass ppm) | $N_{RE}/(N_y + N_{RE})$ | Relative density (%) | Crystal phase | Dielectric constant | | | clamping force (kPa) | Color tone (L*) |
|---|---|---|---|---|---|---|---|---|---|---|---|
| | | | | | | | 1 MHz | 1 kHz | 40 Hz | | |
| Example | 1 $5.0Al_2O_3 \cdot 3.0Y_2O_3$ | None | 75 | 0 | 99.7 | G[2] | 10 | 11 | 12 | 25 | 25 |
| | 2 $5.0Al_2O_3 \cdot 2.7Y_2O_3 \cdot 0.3Sm_2O_3$ | None | 79 | 0.1 | 99.6 | G | 11 | 11 | 10 | 24 | 20 |
| | 3 $5.0Al_2O_3 \cdot 2.1Y_2O_3 \cdot 0.9Sm_2O_3$ | None | 77 | 0.3 | 99.5 | G | 10 | 10 | 10 | 25 | 20 |
| | 4 $5.0Al_2O_3 \cdot 2.7Y_2O_3 \cdot 0.3Gd_2O_3$ | None | 73 | 0.1 | 99.5 | G | 10 | 10 | 10 | 23 | 20 |
| | 5 $5.0Al_2O_3 \cdot 2.7Y_2O_3 \cdot 0.15Gd_2O_3 \cdot 0.15Sm_2O_3$ | None | 74 | 0.1 | 99.6 | G | 10 | 10 | 10 | 25 | 22 |
| | 6 $5.0Al_2O_3 \cdot 4.5Y_2O_3 \cdot 0.5Sm_2O_3$ | None | 79 | 0.1 | 99.5 | G, M[3] | 10 | 10 | 10 | 22 | 24 |
| | 7 $5.0Al_2O_3 \cdot 2.7Y_2O_3 \cdot 0.3Sm_2O_3$ | None | 77 | 0.1 | 99.5 | G | 10 | 10 | 10 | 30 | 15 |
| Comparative Example | 1 $5.0Al_2O_3 \cdot 3.0Y_2O_3$ | Present | 73 | 0 | 99.6 | G | 10 | 20 | 20 | 3 | 82 |
| | 2 $5.0Al_2O_3 \cdot 2.7Y_2O_3 \cdot 0.3Sm_2O_3$ | Present | 75 | 0.1 | 99.5 | G | 10 | 10 | 10 | 2 | 77 |
| | 3 $5.0Al_2O_3 \cdot 2.7Y_2O_3 \cdot 0.3Gd_2O_3$ | Present | 76 | 0.1 | 99.5 | G | 10 | 10 | 10 | 2 | 80 |

Remarks:
[1] Impurity: content of metal elements other than aluminum and rare earth elements
[2] G: garnet type crystal phase
[3] M: monoclinic crystal phase The followings have become clear from the results shown in Table 1.

The sintered body comprising a yttrium aluminum oxide single substance as is the case with Example 1 has a relative density of 99.5% or more and is minute, and it comprises a garnet structure single phase. The dielectric constant at a frequency of 40 Hz is as low as 12, but the clamping force has a large value of 25 kPa. The clamping force of a coulomb type electrostatic chuck is shown by the following equation. A calculated value thereof is about 1 kPa, and therefore the actual value is a 25 times larger value.

$$F = 1/2 \epsilon_o \epsilon_r (V/d)^2$$

In the equation shown above, $\epsilon_o$ is a dielectric constant of vacuum; $\epsilon_r$ is a dielectric constant of a dielectric substance; V is an applied voltage (V); and d is a thickness (m) of the dielectric substance.

Sm and Gd were doped in Examples 2 to 5, and almost the same results as in Example 1 were obtained. Also, the sintered body prepared in Example 6 was changed in a composition and assumed a crystal structure in which two phases of a garnet structure and a monoclinic structure were present in a mixture, but it resulted in providing a still high clamping force. In Example 7, the L* value was reduced, and oxygen deficiency was estimated to be further introduced, so that the clamping force showed a high value. A cause by which the clamping force was elevated was estimated to be attributable to that a plus charge (hole) was produced in order to maintain a balance between charges in oxygen deficiency generated in a crystal lattice and that this hole produced moved to a wafer side in measuring an adsorption characteristic (in applying voltage) to allow an apparent polarizability (coulomb force) to be increased, so that the clamping force grew high.

However, it can be found that the L* value is elevated by carrying out post-annealing treatment as is the case with Comparative Examples 1 to 3. The above L* value shows a brightness of a reflected light and is estimated to be elevated by a reduction in oxygen deficiency which absorbs light. As a result thereof, the relative density, the crystal structure and the dielectric constant are almost the same, but the clamping force is reduced to about 1/10. This is estimated to be attributable to that the above clamping force is close to an inherent clamping force due to a reduction in oxygen deficiency.

Example 8

Figure 2:
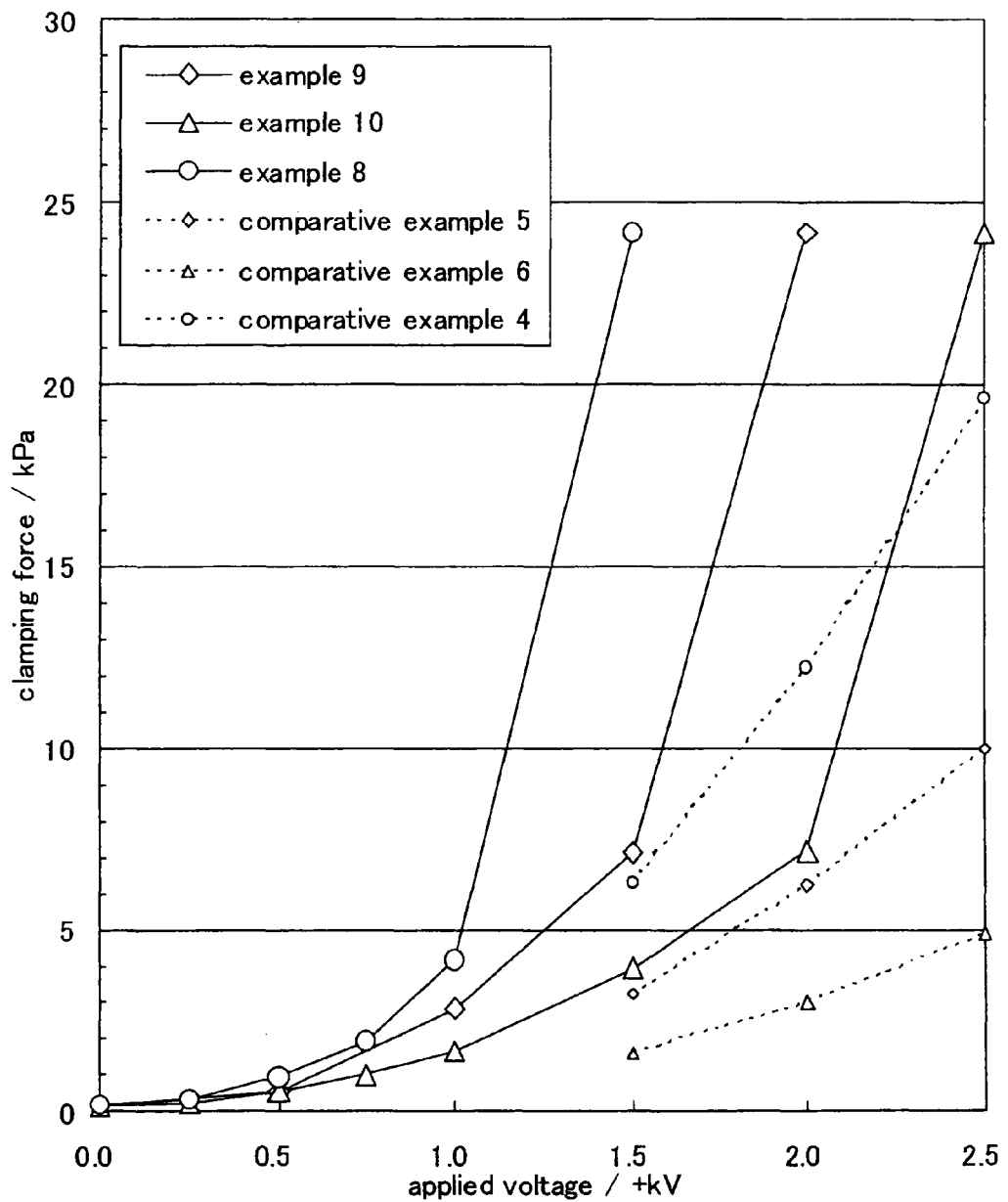
FIG. 2 is a drawing showing a relation of an applied voltage with the clamping force in various thicknesses of the electrostatic chucks.

The sintered body prepared in Example 2 was processed into a tabular body 1 having a thickness of 0.5 mm, and it was used to prepare an electrostatic chuck device 30 shown in FIG. 1. Various voltages were applied at a sample clamping surface temperature set to 25° C. to measure electrostatic absorption amounts (detail thereof is the same as "(5) clamping force of sintered body"). The results thereof are shown in FIG. 2.

Figure 3:
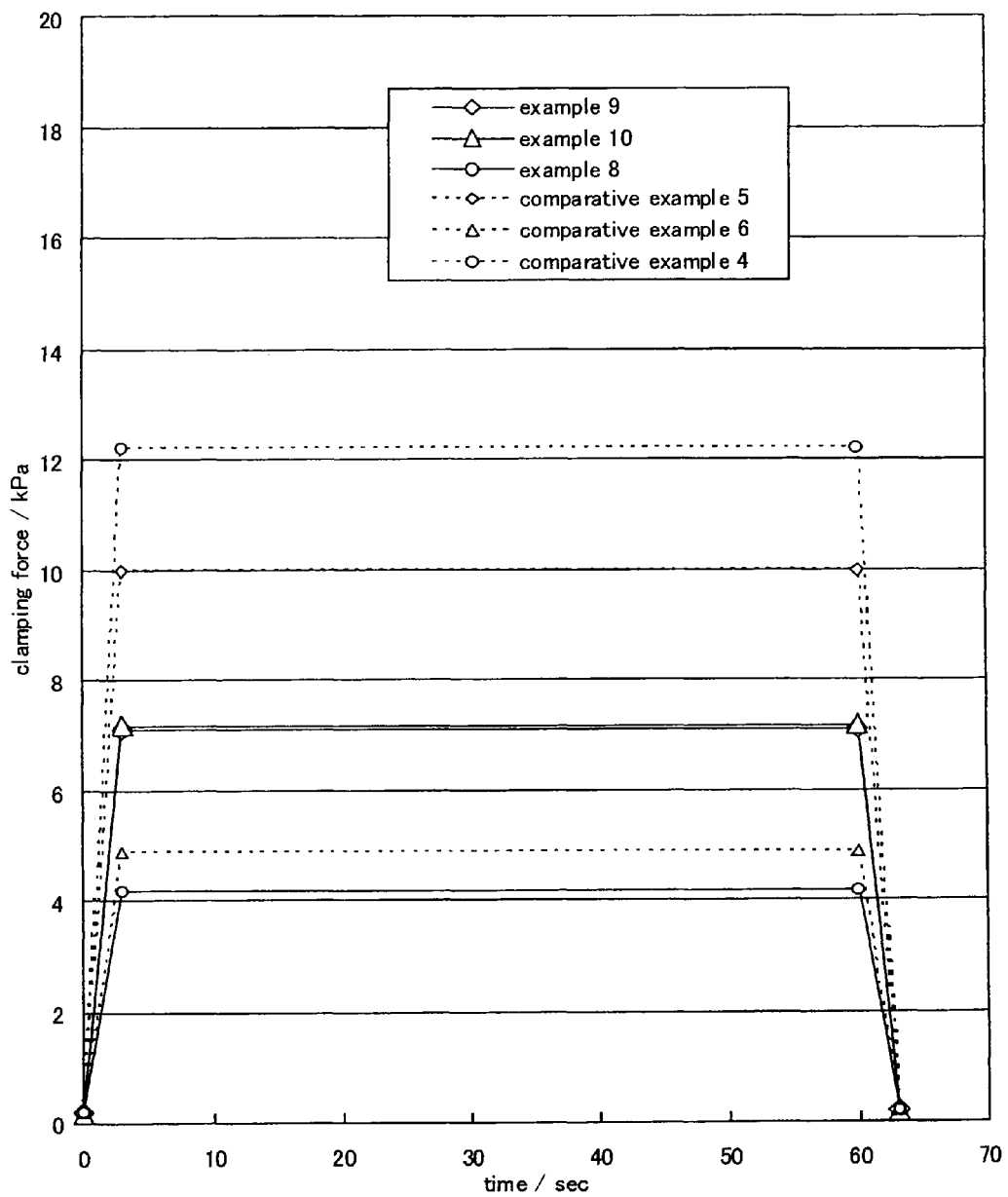
FIG. 3 is a drawing showing results obtained by measuring time elapsing until clamping a sample with electrostatic force is generated and disappears in various thicknesses of the electrostatic chucks.

Further, a voltage of +1.0 kV was applied in order to evaluate time required for electrostatically adsorbing and fixing sufficiently a silicon wafer after applying a voltage of +1.0 kV and time required for detaching the silicon wafer after electrostatically adsorbed, and then time elapsing until the electrostatic absorption amount disappeared since it was generated was measured. The results thereof are shown in FIG. 3.

Example 9

The electrostatic chuck device 30 was prepared in the same manner as in Example 8, except that a thickness of the sintered body prepared in Example 2 was changed to 0.7 mm, and various voltages were applied at a sample clamping surface temperature set to 25° C. to measure electrostatic absorption amounts. The results thereof are shown in FIG. 2. Further, time elapsing until the electrostatic absorptive force disappeared since it was generated was evaluated at an applied voltage of +1.5 kV in the same manner as in Example 8. The results thereof are shown in FIG. 3.

Example 10

The electrostatic chuck device 30 was prepared in the same manner as in Example 8, except that a thickness of the sintered body prepared in Example 2 was changed to 1.0 mm, and various voltages were applied at a sample clamping surface temperature set to 25° C. to measure electrostatic absorption amounts. The results thereof are shown in FIG. 2. Further, time elapsing until the electrostatic absorptive force disappeared since it was generated was evaluated at an applied voltage of +2.0 kV in the same manner as in Example 8. The results thereof are shown in FIG. 3.

Comparative Examples 4 to 6

The electrostatic chuck devices 30 were prepared in the same manner as in Example 8, except that $Al_2O_3$—SiC was used as the sintered body and that a thickness thereof was changed to 0.5 mm (Comparative Example 4), 0.7 mm (Comparative Example 5) and 1.0 mm (Comparative Example 6), and various voltages were applied at a sample clamping surface temperature set to 25° C. to measure electrostatic absorption amounts. The results thereof are shown in FIG. 2. Further, time elapsing until the electrostatic absorptive force disappeared since it was generated was evaluated at applied voltages of +2.0 kV (Comparative Example 4), +2.5 kV (Comparative Example 5) and +2.5 kV (Comparative Example 6) in the same manner as in Example 8. The results thereof are shown in FIG. 3.

As apparent from FIG. 2, it can be found that the sufficiently high clamping force can be secured in Example 8 at a lower voltage than in a conventional product (Comparative Example 4) having the same thickness. It can be found that the sufficiently high clamping force can be secured as well in Example 9 at a lower voltage than in a conventional product (Comparative Example 5) and that the withstand voltage is enhanced as well. Further, it can be found that the withstand voltage is enhanced by two times those of conventional products as well in Example 10 while securing the equal clamping force at a voltage equivalent to that in a conventional product (Comparative Example 6). It can be found from the above results that the sufficiently high clamping force can be secured at a low voltage in the electrostatic chuck devices according to the present invention even if the electrostatic chuck has the same dielectric substance thickness as ever. Further, it can be found that the sufficiently high clamping force can be secured even at the same applied voltage as ever in the state that the dielectric layer is increased in a thickness (in the state that the withstand voltage is enhanced).

"The withstand voltage" referred to herein means voltage which can be applied per mm of a material (unit: kV/mm). An electrostatic chuck is operated by electricity and therefore can preferably be operated at a lower voltage. When it is used in plasma, the risk that an abnormal voltage is generated between members, for example, between a wafer and an internal electrode is involved therein, and therefore an applicable (endurable) voltage is preferably higher so that a dielectric substance is not broken by discharge and the like when an abnormal voltage is generated.

Also, it can be found from FIG. 3 that time elapsing until the electrostatic clamping force disappears since it is generated is short in all of Examples 8 to 10 (the electrostatic chuck devices prepared in Examples 9 and 10 are evaluated at almost the same clamping force). When a thickness of the electrostatic chuck device is increased, it is generally anticipated that the clamping force is generated after the electric source is on and off and that time elapsing until disappearing is extended. In a case of the present examples, however, it can be found that time elapsing until disappearing since generated can be shortened to the same level as ever even if the thickness is increased.

As explained above, assuming that a part exposed to a halogen base corrosive gas or a plasma thereof in the electrostatic chuck of the present invention and the electrostatic chuck device equipped with the same is constituted from a yttrium aluminum composite oxide sintered body or a composite oxide sintered body containing aluminum, yttrium and a rare earth element excluding yttrium and that an L* value (brightness) of a reflected color tone of the sintered body described above which is measured on prescribed conditions in a CIEL*a*b* color system falls in a specific range, oxygen deficiencies are considered to be present in an inside thereof. As a result thereof, degradation thereof and generation of particles are not brought about even if exposed to the corrosive gas the plasma thereof described above, and the electrostatic chuck for producing a semiconductor can be provided with commercially satisfactory clamping force of 10 kPa or more at an applied voltage of 1.5 V.

Further, an increase in the clamping force makes it possible to increase a thickness of the dielectric substance layer as compared with those of conventional metal oxides, and therefore the withstand voltage is elevated as well. Also, a risk of breakage in operation is reduced, and a risk of cracking during processing is reduced as well.

INDUSTRIAL APPLICABILITY

The electrostatic chuck of the present invention is an electrostatic chuck used for holding a semiconductor wafer in a semiconductor manufacturing equipment, and it has the sufficiently high clamping force even in halogen base corrosive gases such as a fluorine base corrosive gas, a chlorine base corrosive gas and the like and plasma thereof.

The electrostatic chuck device of the present invention can be operated at a low voltage, and a thickness of the insulating dielectric material constituting the sample clamping surface can be increased to, for example, 0.3 mm or more.

What is claimed is:

1. An electrostatic chuck, comprising:
    an yttrium aluminum composite oxide sintered body or a composite oxide sintered body comprising aluminum, yttrium and a rare earth element excluding yttrium;
    wherein, in the composite oxide sintered body, an L* value of a reflected color tone measured by a C light source on a 2° angle visual field condition is 10 or more and 50 or less in a CIE (International Illumination Committee) L*a*b* color system prescribed in JIS Z 8729-1994.

2. The electrostatic chuck according to claim 1, wherein a content of metal elements other than aluminum and the rare earth element in the composite oxide sintered body is 500 ppm by mass or less.

3. The electrostatic chuck according to claim 1 or 2, wherein a crystal structure of the composite oxide sintered body comprises oxygen deficiencies.

4. The electrostatic chuck according to claim 1, wherein a crystal structure of the composite oxide sintered body is:
    a crystal structure which is a garnet type crystal phase; or
    a crystal structure comprising a garnet type crystal phase and at least one selected from a perovskite type crystal phase and a monoclinic crystal phase.

5. The electrostatic chuck according to claim 1, wherein:
    the rare earth element excluding yttrium is samarium and/or gadolinium; and
    a ratio ($N_{RE}/(N_Y+N_{RE})$) of a number of atoms ($N_{RE}$) of either one or both of samarium and gadolinium to a sum ($N_Y+N_{RE}$) of a number of atoms ($N_Y$) of yttrium and the number of atoms ($N_{RE}$) of either one or both of samarium and gadolinium is 0 or more and less than 0.5.

6. A process for producing the electrostatic chuck according to claim 1, comprising:
    calcining a green body having a prescribed shape comprising aluminum oxide and yttrium oxide or aluminum oxide, yttrium oxide, and an oxide of a rare earth element excluding yttrium to obtain the composite oxide sintered body;
    wherein the calcining is carried out under a vacuum, an inert gas atmosphere, or a reducing gas atmosphere at a temperature of 1000° C. or higher and 1800° C. or lower.

7. An electrostatic chuck device, comprising an electrostatic chuck member (A) comprising:
    a tabular body with a clamping surface for clamping a sample by electrostatic force;
    an internal electrode layer for clamping a sample by electrostatic force which is provided on a back face of the tabular body; and
    an insulation layer;
    wherein:
    at least the clamping surface of the tabular body comprises a composite oxide sintered body;
    the composite oxide sintered body comprises an yttrium aluminum composite oxide sintered body or a composite oxide sintered body comprising aluminum, yttrium and a rare earth element excluding yttrium; and
    wherein, in the composite oxide sintered body, an L* value of a reflected color tone measured by a C light source on a 2° angle visual field condition is 10 or more and 50 or less in a CIE (international Illumination Committee) L*a*b* color system prescribed in JIS Z 8729-1994.

8. The electrostatic chuck device according to claim 7, further comprising a base member (B) for controlling temperature in which a flow channel for circulating a medium is provided.

9. The electrostatic chuck device according to claim 8, wherein:
    the electrostatic chuck member (A) is prepared by integrating the tabular body, the internal electrode, and the insulation layer via an adhesive layer; and
    the electrostatic chuck member (A) is integrated with the base member (B) for controlling temperature via an adhesive layer.

10. The electrostatic chuck device according to claim 7, wherein a resistive heating element is provided between the electrostatic chuck member (A) and the base member (B) for controlling temperature.

11. The electrostatic chuck device according to claim 7, wherein, when the composite oxide sintered body is processed to a thickness of 0.5 mm and a voltage of 1.5 kV is applied to the electrostatic chuck member at a sample clamping surface temperature of 25° C., the composite oxide sintered body exhibits an electrostatic force of from 10 to 30 kPa.

12. The electrostatic chuck device according to claim 7, wherein the composite oxide sintered body has a thickness of 0.3 to 2.0 mm.

13. The electrostatic chuck device according to claim 8, wherein a resistive heating element is provided between the electrostatic chuck member (A) and the base member (B) for controlling temperature.

* * * * *